(12) United States Patent
Hu et al.

(10) Patent No.: US 9,306,126 B2
(45) Date of Patent: Apr. 5, 2016

(54) OXIDES WITH THIN METALLIC LAYERS AS TRANSPARENT OHMIC CONTACTS FOR P-TYPE AND N-TYPE GALLIUM NITRIDE

(71) Applicant: Intermolecular, Inc., San Jose, CA (US)

(72) Inventors: Jianhua Hu, Palo Alto, CA (US); Heng-Kai Hsu, Hisnchu (TW); Minh Huu Le, San Jose, CA (US); Sandeep Nijhawan, Los Altos, CA (US); Teresa B. Sapirman, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/330,616

(22) Filed: Jul. 14, 2014

(65) Prior Publication Data

US 2016/0013367 A1 Jan. 14, 2016

(51) Int. Cl.
*H01L 29/15* (2006.01)
*H01L 33/42* (2010.01)
*H01L 33/00* (2010.01)
*H01L 33/32* (2010.01)

(52) U.S. Cl.
CPC ............ *H01L 33/42* (2013.01); *H01L 33/0075* (2013.01); *H01L 33/32* (2013.01); *H01L 2933/0016* (2013.01)

(58) Field of Classification Search
CPC .................... H01L 22/42; H01L 22/0075
See application file for complete search history.

(56) References Cited

U.S. PATENT DOCUMENTS

| 7,582,161 B2 | 9/2009 | Ahn et al. | |
|---|---|---|---|
| 2007/0034891 A1* | 2/2007 | Song | H01L 33/42 257/103 |
| 2009/0065795 A1* | 3/2009 | Chan | H01L 33/42 257/99 |

FOREIGN PATENT DOCUMENTS

WO 2009075585 A1 6/2009

OTHER PUBLICATIONS

Kim et al.; Effective Work Function Control of Indium-tin-oxide Electrodes; Oct. 2011; Journal of the Korean Physical Society, vol. 59, No. 4; pp. L2655-L2657.

* cited by examiner

*Primary Examiner* — Wael Fahmy
*Assistant Examiner* — Sarah Salerno

(57) ABSTRACT

Transparent conductive layers usable as ohmic contacts for III-V semiconductors with work functions between 4.1 and 4.7 eV are formed by annealing layers of transparent oxide with thin (0.1-5nm) layers of conductive metal. When the layers interdiffuse during the annealing, some of the conductive metal atoms remain free to reduce resistivity and others oxidize to reduce optical absorption. Examples of the transparent oxides include indium-tin oxide, zinc oxide, and aluminum zinc oxide with up to 5 wt % Al. Examples of the metals include aluminum and titanium. The work function of the transparent conductive layer can be tuned to match the contacted semiconductor by adjusting the ratio of metal to transparent oxide.

20 Claims, 5 Drawing Sheets

OXIDES WITH THIN METALLIC LAYERS AS TRANSPARENT OHMIC CONTACTS FOR P-TYPE AND N-TYPE GALLIUM NITRIDE

BACKGROUND

Related fields include light-emitting diodes (LEDs) and other optoelectronic devices based on III-V materials, and transparent conductive films for optoelectronic devices.

A typical LED emits light from an active photoemissive semiconductor layer sandwiched between p-type and n-type semiconductor layers. Electroluminescence results when negative charge carriers (electrons) from the n-type layer and positive charge carriers ("holes") from the p-type layer meet and combine in the active photoemissive layer.

The wavelength and color of the emitted light depends, at least in part, on the semiconductor bandgap. For example, arsenides of aluminum (Al), gallium (Ga), indium (In), and their alloys emit red and infrared light; phosphides of Al, Ga, In, and their alloys emit green, yellow, or red light; and nitrides of Al, Ga, In, and their alloys emit ultraviolet, violet, blue, or green light. These "III-V materials," so-called because they include elements from old group III (now group 13) and old group V (now group 15) of the periodic table, have high carrier mobility and direct bandgaps that are desirable in optoelectronic applications. However, substrates made of III-V materials have historically been very expensive. GaN and AlN substrates are becoming increasingly available, but problems with instability and defects persist. A common alternative approach has been to grow III-V layers by epitaxy on a different substrate material such as sapphire ($Al_2O_3$), silicon (Si), silicon carbide (SiC), germanium (Ge), zinc oxide (ZnO), and glass.

A "junction-up" LED emits its output light in a direction pointing away from the substrate, while an inverted, or "flip-chip," LED emits its output light toward the substrate. Both types may use transparent electrodes on the light-emitting side to facilitate the passage of both electrical current and light through the semiconductor stack. Other devices with similar requirements for current and light traversing the same surface also use transparent electrodes. Many thin-film materials for transparent electrodes are oxides, and are generically known as "transparent conductive oxides" (TCO).

Indium tin oxide, (ITO), the most common TCO material for transparent electrodes, is expensive because it is typically over 90% indium. The optical transparency and the conductivity generally need to be traded off against each other because the highest-transparency formulations are generally different from the highest-conductivity formulations. In addition, both the optical transparency and the conductivity may be unstable with temperature, and therefore may change unpredictably during high-temperature process steps, such as annealing, that may be required to fabricate either the TCO itself or other parts of the device.

As with any other electrode material, another variable that needs to be optimized is the work function. If a low-loss ohmic contact to a semiconductor is desired, a generally necessary (though sometimes insufficient) condition is a close match between the electrode work function and the semiconductor work function. Because p-type and n-type semiconductors have different work functions, so must their electrodes. In some instances this requires the p-type and n-type electrodes to be made from different materials, which is inconvenient and adds to the cost of production.

Therefore, a need exists for a cost-effective TCO material with transmissivity and conductivity that are stable throughout the temperature range of fabrication processes for LEDs and other optoelectronic devices. Preferably, the TCO material should be tunable to match the work functions of both p-type and n-type III-V materials, such as p-GaN and n-GaN (4.2 eV).

SUMMARY

The following summary presents some concepts in a simplified form as an introduction to the detailed description that follows. It does not necessarily identify key or critical elements and is not intended to reflect a scope of invention.

Embodiments of a method for forming a transparent conductive layer include forming one or more thin layers of metal over, under, or inside one or more layers of a transparent oxide and annealing the layers. For example, the metal layers may be 1-10 monolayers or 0.1-5 nm thick, and the finished transparent conductive layer (metal layers and oxide layers) may be 50-100 nm thick. The transparent conductive layer may have an optical absorption below about 0.03%/nm for a visible wavelength of light (between 400 nm and 650 nm).

The transparent conductive layer may be in contact with a III-V semiconductor, such as n-GaN or p-GaN, and may form an ohmic contact. For example, the work function of the ohmic contact layer may match a work function of the III-V semiconductor within ±0.2 eV. The specific contact resistivity of the interface between the transparent conductive layer and the semiconductor layer may be less than about 0.005 $\Omega$-$cm^2$.

The layers may be formed by physical vapor deposition (PVD, e.g., sputtering). For example, the metal and the oxide may be sputtered from different targets in the same chamber. A chamber ambient may include argon and optionally may include up to 5 vol % oxygen. The layers may be formed at a substrate temperature between about 20 C and 300 C.

The annealing (e.g., heating the substrate to about 350-650 C for 3-10 minutes in a nitrogen-containing ambient) may cause the metal layer(s) and the metal-oxide layer(s) to interdiffuse. Some of the atoms from the metal layer may remain unbound and dispersed through the oxide, increasing the conductivity of the transparent conductive layer. Some of the atoms from the metal layers may bond with oxygen, becoming incorporated in the oxide and increasing the transparency or transmissivity of the transparent conductive layer. In addition, in some embodiments the annealing may crystallize the transparent conductive layer; e.g., it may be 30% crystalline or more as measured by X-ray diffraction.

The composition of the transparent conductive layer determines the work function. The composition may be selected to match semiconductor work functions between about 4 eV and 5 eV so that the transparent conductive layer forms an ohmic contact with a particular semiconductor. In some embodiments, the composition is selected to produce a work function that matches n-GaN or p-GaN (~4.2 eV) and the transparent conductive layer forms an ohmic contact with n-GaN or p-GaN. The semiconductor may be a bulk material (e.g., a substrate or a doped region of a substrate) or a layer formed over a substrate. The transparent conductive layer may be formed under or over the semiconductor, and may be formed before or after the semiconductor.

In some embodiments, the metal in the metal layers is different from the metal in the oxide layers. For example, the metal layers may include aluminum (Al) or titanium (Ti) and the oxide layers may include indium tin oxide (ITO), zinc oxide (ZnO), aluminum zinc oxide (AZO) or indium zinc oxide (IZO). The ITO may be about 90 wt % indium oxide and about 10 wt % tin oxide. The AZO may contain 0.1-5 wt % Al. The IZO may contain 0.1-5 wt % In.

Embodiments of optoelectronic devices include transparent ohmic contact layers for semiconductors with work functions between about 4 eV and 5 eV. The transparent ohmic contact layers may include an oxide of a first metal containing diffused atoms of a second metal. Some of the diffused atoms of the second metal may be oxidized. The transparent ohmic contact layers may include substitutional defects where an atom of the second metal replaced an atom of the first metal in the oxide. The concentration of the second metal may be uniform (e.g., within 10% of a constant value) within the layer, or it may vary with depth (i.e., in a direction perpendicular to the layer surface).

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially equal," "substantially unchanged" and the like contemplate up to 5% variation.

"Horizontal" defines a plane parallel to the plane or surface of the substrate. "Vertical" shall mean a direction perpendicular to the horizontal. "Above," "below," "bottom," "top," "side" (e.g. sidewall), "higher," "lower," "upper," "over," and "under" are defined with respect to the horizontal plane. "On" indicates direct contact; "above" and "over" allow for intervening elements. "On" and "over" include conformal configurations covering feature walls oriented in any direction.

"Substrate," as used herein, may mean any workpiece on which formation or treatment of material layers is desired. Substrates may include, without limitation, silicon, germanium, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter. Furthermore, the substrates may be processed in many configurations such as single substrate processing, multiple substrate batch processing, in-line continuous processing, in-line "stop and soak" processing, or roll-to-roll processing.

"Ohmic contact" as used herein shall refer to a specific contact resistivity less than about 0.01 $\Omega$-cm$^2$. "Transparent" and "transmissive" (and derivatives such as "transparency" and "transmissivity") may be used interchangeably herein and, unless the text or context indicates otherwise, refer to transmission of normally-incident light in the 400 nm-700 nm wavelength range. Moreover, unless otherwise indicated, a "transparent" layer is more than about 50% transmissive.

Figure 1A:
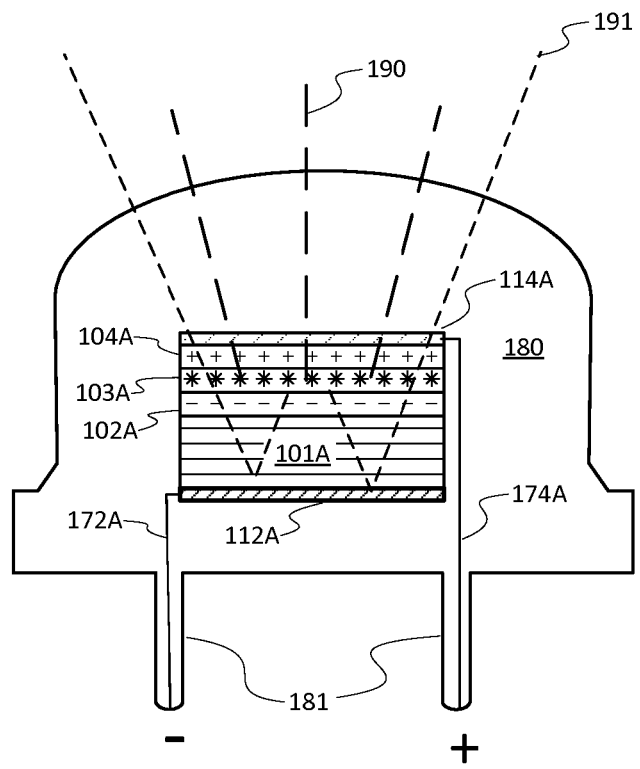
FIGS. 1A and 1B conceptually illustrate examples of LEDs.
Figure 1B:
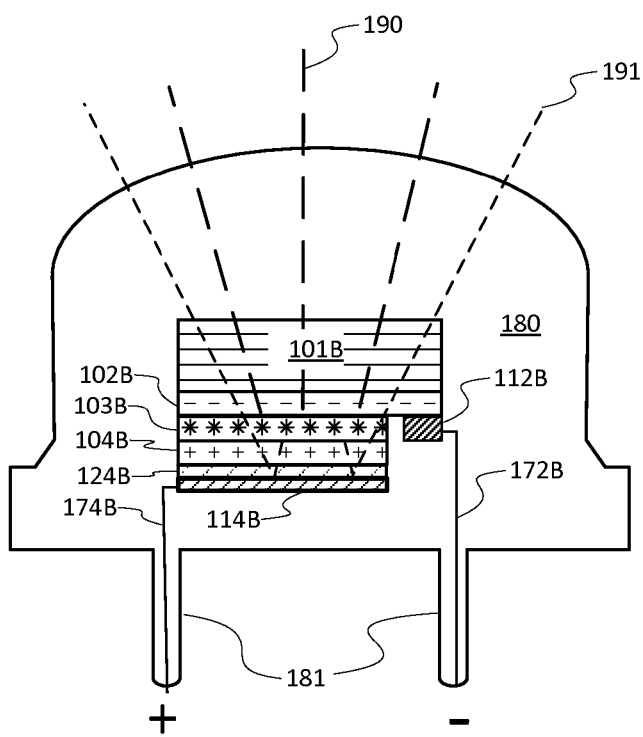

FIGS. 1A and 1B conceptually illustrate examples of LEDs. Many different LED designs exist, and new ones continue to be introduced. These examples are intended to provide basic context and do not limit the scope of application of the described components and methods.

FIG. 1A illustrates an example of a junction-up LED. A "junction-up" LED emits light from the side opposite the substrate, through a transparent or semi-transparent electrode. Inside the transparent envelope of package 180, substrate 101A supports n-type semiconductor layer 102A, active photoemissive layer 103A, and p-type semiconductor layer 104A. Collectively, the n-type, photoemissive, and p-type layers, along with any intervening layers between them, may be referred to as the "active stack." Current delivered through terminal pins 181 is conducted through leads 172A and 174A to negative electrode 112A and positive electrode 114A. Some junction-up LEDs have one electrode on the "top" (the side of the film stack farthest from the substrate) and one on the "bottom" (the side of the film stack nearest the substrate). The current causes negative charge-carriers to migrate from n-type layer 102A into active photoemissive layer 103A, and positive charge-carriers to migrate from p-type layer 104A into active photoemissive layer 103A. When the negative charge-carriers and positive charge-carriers recombine in active photoemissive layer 103A, photons of light are emitted.

Upward-directed light 190 passes through positive-polarity contact 114A, illustrated here as a transparent electrode. In some LEDs, positive-polarity contact 114A is opaque or reflecting, but only covers part of the top surface so that light may emerge from the uncovered parts of the surface. Downward-directed light 191 passes through substrate 101A and is reflected from reflective negative-polarity contact 112A to redirect it upward, where it exits from the top surface.

In some junction-up LEDs, reflective negative-polarity contact 112A is between substrate 101A and n-type layer 102A. These designs do not require substrate 101A to be transparent; it may be an opaque material such as silicon carbide. In some junction-up LEDs, the positive-polarity components are underneath the active photoemissive layer and the negative-polarity components are above it.

FIG. 1B illustrates an example of a flip-chip LED. A flip-chip LED is fabricated to emit its output light toward the substrate. Originally, the film stack is formed on substrate 101B, but when the die is installed in package 180, it is inverted or "flipped" upside-down to position substrate 101B on top. Thus "substrate" 101B becomes a "superstrate." In the illustrated example, superstrate 101B remains as part of the finished device, and therefore preferably transmits the emitted wavelength(s). In some embodiments, superstrate 101B is removed from the finished device, so its transparency is not a constraint. In the illustrated example, part of the surface of n-type semiconductor layer 102B is exposed to allow the attachment of negative-polarity contact 112B, which makes contact only with part of the n-type layer. In some LEDs, this removes or relaxes the requirement that negative-polarity contact 112B have any particular optical properties such as transparency.

When current passes through the device from pins 181 through leads 172B and 174B, light is emitted from active photoemissive layer 103B. Light emitted from active photoemissive layer 103B toward superstrate 101b is transmitted directly out of the device. Light emitted from active photoemissive layer 103B toward p-type layer 104B is reflected from reflective positive-polarity contact 114B, which redirects it upward through superstrate 101B.

Transparent conductive oxide (TCO) materials are used, for example, as top (positive-polarity) electrode 114A in FIG. 1A, forming a contact to p-doped layer 104A. In some embodiments, such as if a material is not available for reflective contact 114B that both forms an ohmic contact to p-type layer 104B and has high reflectivity at the LED's operating wavelength, a TCO layer 124B may be interposed between p-type layer 104B and reflective contact 114B. In that way, the TCO 124B provides the desired electrical properties and the reflective layer 114B provides the desired optical properties.

Transparent conductive oxides such as ITO and ZnO provide desirable optical properties (e.g., high transmissivity at wavelengths that are generated or sensed by III-V materials such as n-GaN and p-GaN). However, they may have insufficient conductivity or insufficient work-function matching to serve as ohmic contacts to these materials. For instance, ITO resistivity is usually $10^{-4}$-$10^{-3}$ $\Omega$-cm and its work function is 4.3-4.5 eV; ZnO resistivity is usually about $1.8 \times 10^{-4}$ $\Omega$-cm and its work function is about 4.7 eV. Meanwhile, metals such as Al (work function ~4.06-4.26 eV) and Ti (work function ~4.33 eV) are highly conductive, but not transparent except in layers much thinner than typical ohmic contacts.

A composite transparent conductive layer can be formed by constructing a stack of one or more layers of a transparent oxide and one or more layers of a conductive metal, then annealing the stack to interdiffuse the layers. The composite layer may exhibit higher conductivity while still maintaining acceptable transparency. In addition, the work function can be adjusted by manipulating the ratio of oxide to conductive metal in the stack.

Figure 2:
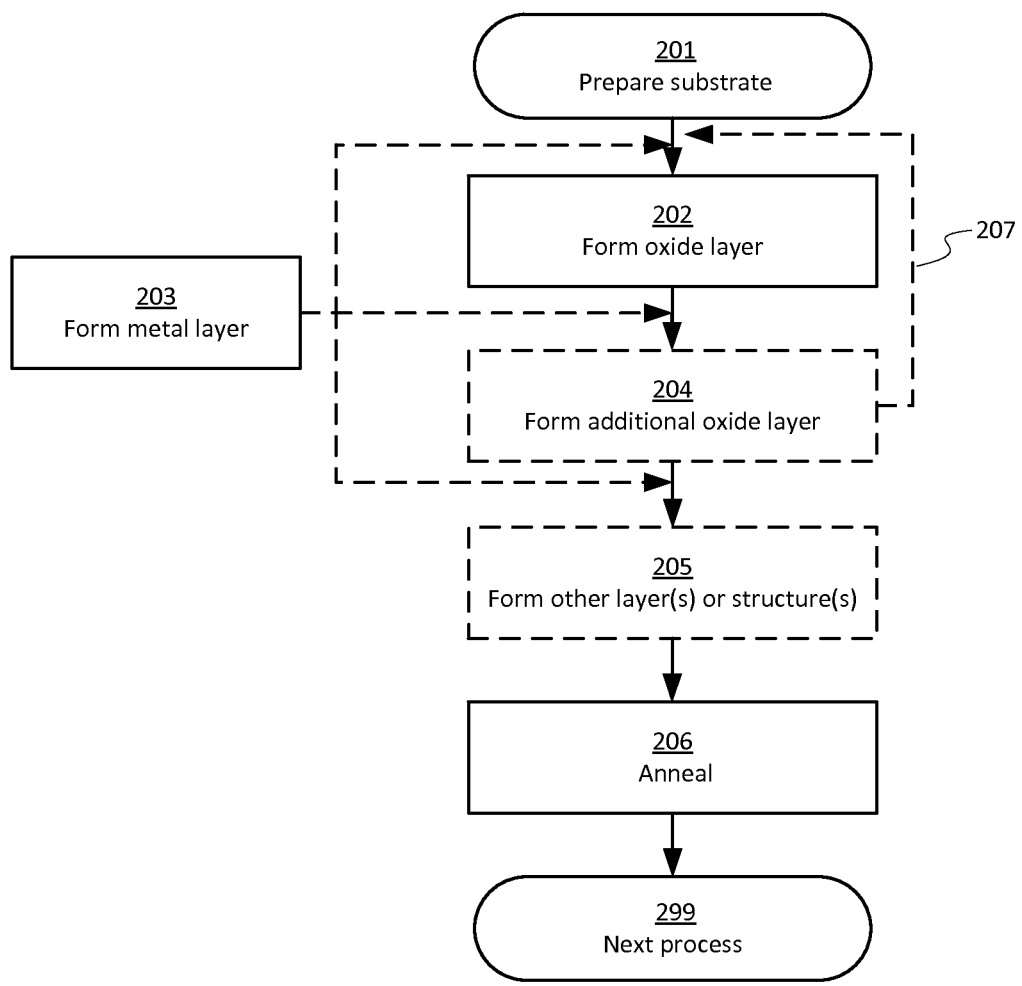
FIG. 2 is a flowchart of an example process for forming some embodiments of transparent conductive contacts.

FIG. 2 is a flowchart of an example process for forming some embodiments of transparent conductive contacts. Step 201 of preparing the substrate may include cleaning, degassing, various treatments such as plasma treatments, or the formation of one or more underlying structures. In some embodiments, the substrate or an underlying structure may include a semiconductor such as p-GaN or n-GaN. Step 202 of forming the oxide layer and optional step 204 of forming an additional oxide layer may be either preceded or followed by step 203 of forming a metal layer. In some embodiments, the metal layer formed in step 203 is 0.5-5 nm thick, or 1-10 monolayers, to avoid optical opacity at the wavelength of interest. The metal layer of step 203 may be formed either above or below the oxide layer of step 203, or may be between two oxide layers, or all three. Optional loop path 207 indicates that additional oxide layers and metal layers may be added until the stack reaches the desired thickness of the composite layer (e.g., 50-100 nm).

Step 206 of annealing the stack may be done at any time after steps 202, 203 and optionally 204. Optional step 205 of forming one or more other layers or structures (which may optionally include a semiconductor such as p-GaN or n-GaN) may be done before step 206. In some embodiments, annealing 206 may also provide a heat treatment for a structure formed before or after the metal/oxide stack (e.g., activating a diode or repairing defects caused by an ion bombardment). After annealing 206, next process 299 may commence. In some embodiments, next process 299 may include forming an overlying structure, which may include a semiconductor such as p-GaN or n-GaN.

Figure 3A:
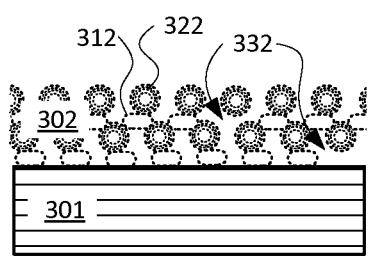
FIGS. 3A-3D conceptually illustrate a possible model of the formation of the composite layer.

FIGS. 3A-3D conceptually illustrate a possible model of the formation of the composite layer. The graphic symbols are not intended to realistically represent particular atoms, molecules, or morphologies, but only to differentiate the layers and materials. In FIG. 3A, transparent oxide layer 302 is formed on substrate 301. Substrate 301 may have underlying layers and structures that are not explicitly shown. Transparent oxide layer 302 includes oxygen atoms 322 and at least one type of metal atom 312. The dotted outlines of the "atoms" connote the optical transparency of the layer. Some embodiments of transparent oxide layer 302 may include more than one metal, such as ITO, AZO or IZO, but for simplicity in this explanation only one type of metal is shown. Some metal atoms may be missing, creating available oxygen valencies at defects 332.

Figure 3B:
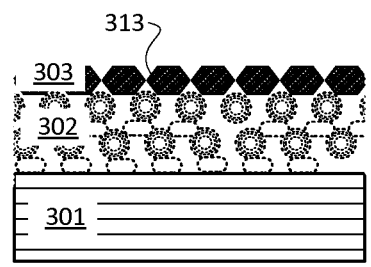

In FIG. 3B, a conductive metal layer 303 of metal atoms 313 is formed over transparent oxide layer 302. Conductive metal layer 303 may be less transparent than oxide layer 302, but layer 303 may be thin (0.5-5 nm) enough to transmit, e.g., 10% or more of normally incident light at the wavelength of interest. Although only one type of metal atom 313 is illustrated, layer 303 may include more than one metal.

Figure 3C:
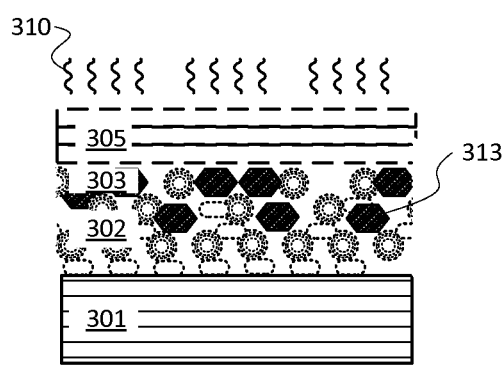

In FIG. 3C, the layers are annealed with heat 310, either directly after layers are 302 and 303 are formed, or optionally after overlying layers or structures 305 are formed. Heat 310 causes metal atoms 313 from layer 303 to diffuse into transparent oxide layer 302.

Figure 3D:
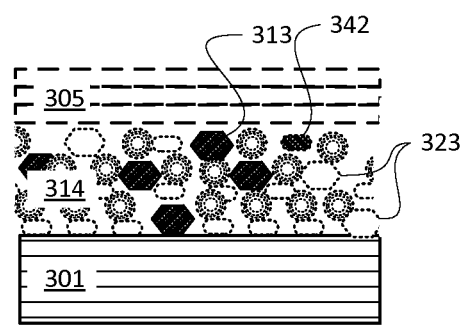

In FIG. 3D, the stack of transparent oxide layer 302 and conductive metal layer 303 is interdiffused to become composite transparent conductive oxide layer 314. Without being restricted to any particular theory, it is believed that when the conductive metal layer 303 diffuses into the oxide layer 302, some of the conductive metal atoms 313 disperse through the oxide but remain free (unbonded). Because electrons can tunnel through the small spaces between the free metal atoms 313 more easily than through the thickness of an entire layer of unaltered oxide, the added metal makes the composite layer more conductive than the unaltered oxide. Other conductive metal atoms may become oxidized metal 323 by bonding to available oxygen valencies (e.g., dangling bonds) in the oxide at defect sites 332, or they may replace the existing metal (e.g., In or Zn) in an existing oxide bond, creating a replacement defect. These atoms 323 that become part of the oxide increase the transparency of the composite layer and offset some of the absorbance introduced by the added metal. Metal atoms 342 that were part of the oxide before being displaced may remain free and contribute to conductivity, or may encounter another oxygen bonding site and contribute to transparency.

Figure 4A:
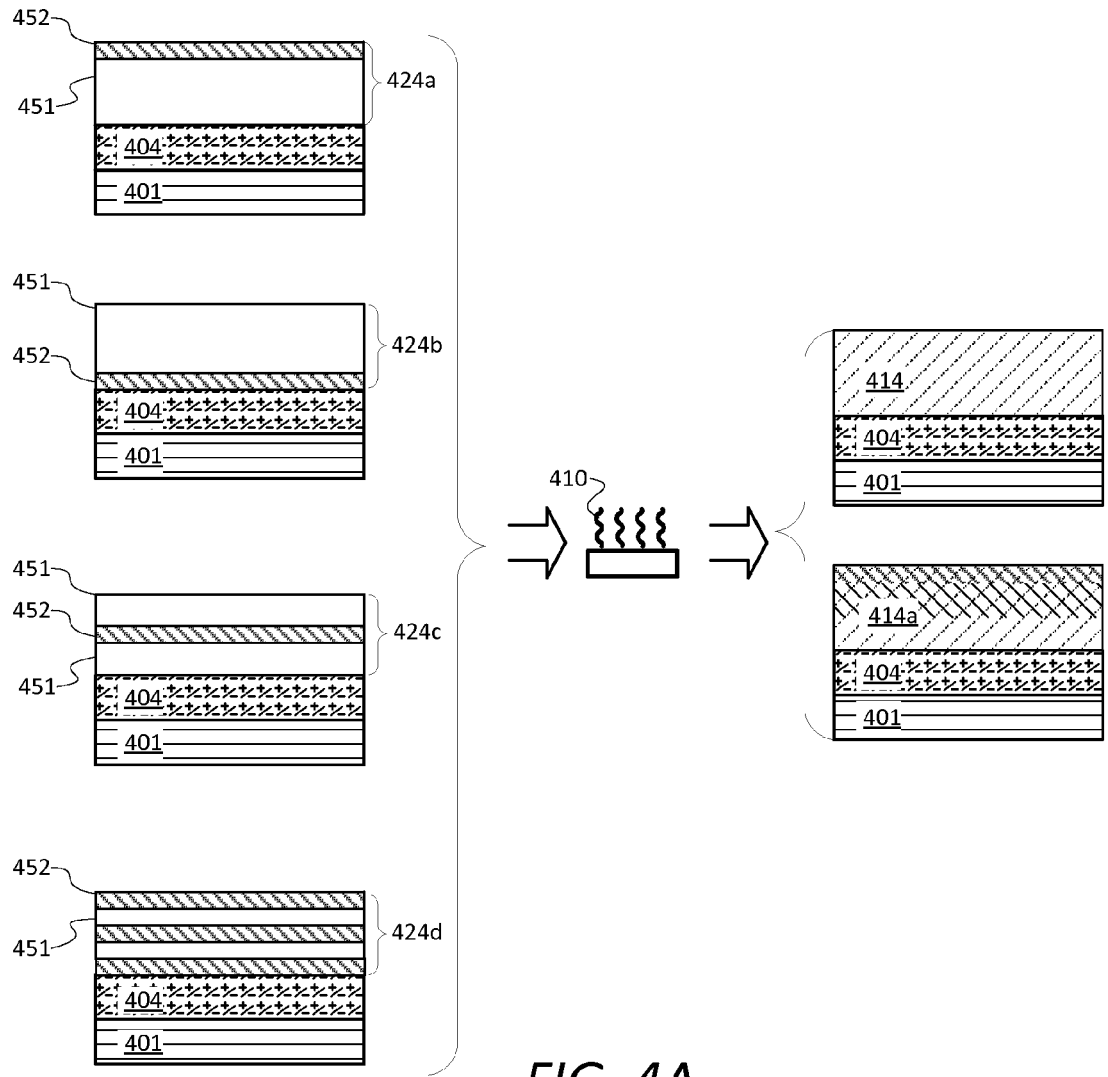
FIGS. 4A and 4B conceptually illustrate some embodiments of transparent conductive contacts at various stages of fabrication.
Figure 4B:
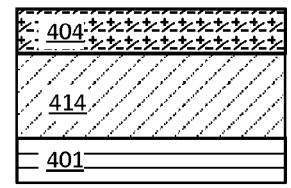

FIGS. 4A and 4B conceptually illustrate some embodiments of transparent conductive contacts at various stages of fabrication. Stack 424a has a conductive metal layer 452 over a transparent oxide 451. Stack 424b has a conductive metal layer 452 under a transparent oxide 451. Stack 424c has a conductive metal layer 452 between two layers of transparent oxide 451. Stack 424d is a nanolaminate of multiple conductive metal layers 452 and transparent oxide layers 451.

Any of these stacks, after annealing 410, can produce composite transparent conductive layer 414. In some embodiments, layer 414 may have a substantially uniform composition (e.g., the weight ratios of the metals may be constant within±10% throughout the layer). Alternatively, the composite layer may have a composition gradient from incomplete interdiffusion. As an example, layer 414a, made by annealing stack 424a, is incompletely interdiffused and has a higher weight percentage of conductive metal near the top than near the bottom. Any of the other stacks may be incompletely interdiffused with analogous results. A composition gradient may be advantageous, for example, if the top and bottom interfaces need to match different work functions, bandgaps, or optical refractive indices.

In the examples of FIG. 4A, the substrates have semiconductor structures 404, which may be undoped, p-doped, or n-doped, underneath the oxide/metal stacks. FIG. 4B illustrates an example where composite transparent conductive layer 414, or at least its constituent stack (e.g. one of 424a-d) was formed before the semiconductor structure 404. For example, the substrate may be sapphire or silicon carbide and the semiconductor structure may be formed from deposited layers.

In some embodiments, the transparent oxide and conductive metal layers may be formed by physical vapor deposition (PVD), e.g., sputtering.

Figure 5:
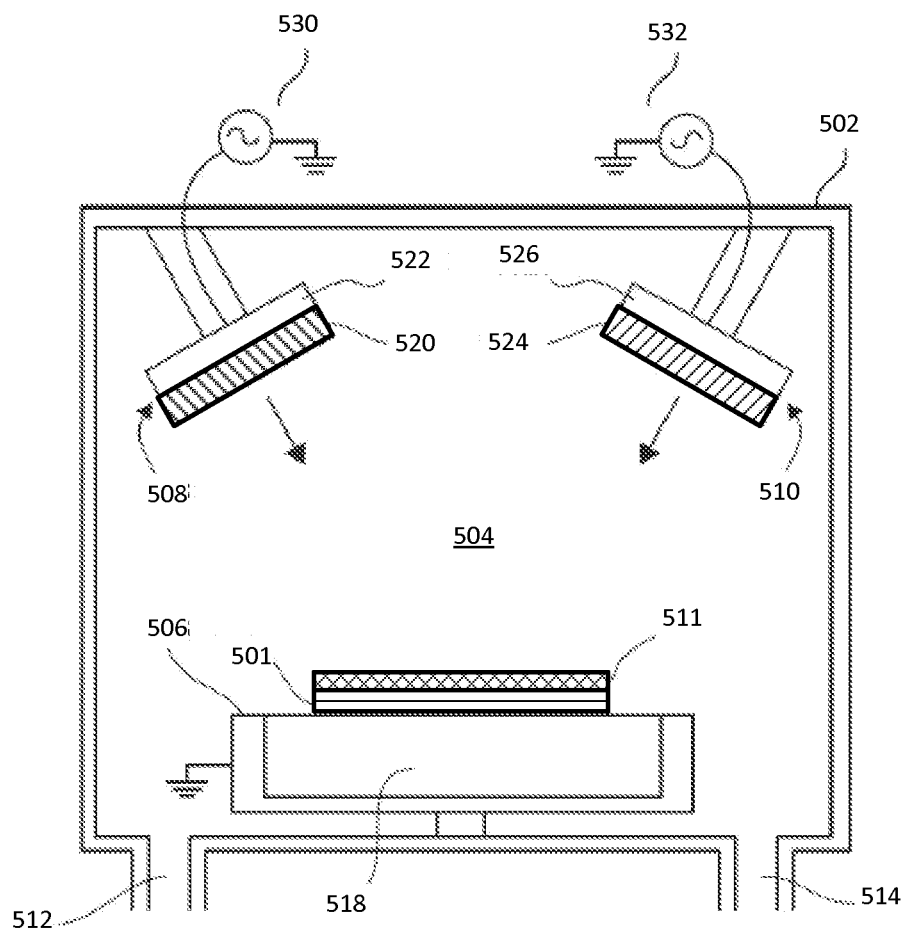
FIG. 5 conceptually illustrates an example PVD tool that may be used to form some of the described layers.

FIG. 5 conceptually illustrates an example PVD tool that may be used to form some of the described layers. The PVD tool includes a housing 502 enclosing a process chamber 504, a substrate support 506, a first target assembly 508, and a second target assembly 510. Substrate support 506 is configured to support a substrate 501 and may include a support electrode 518, which may be held at ground potential during processing, as indicated. Substrate 506 may have the capability to move the substrate during processing, or may interact with other mechanisms (not shown) to load and unload substrates.

First and second target assemblies (or process heads, which may be sputter guns) 508 and 510 are suspended above substrate 501 in processing chamber 504. First target assembly 508 includes a first target 520 and a first target electrode 522. Second target assembly 510 includes a second target 524 and a second target electrode 526. First target 520 and second target 524 may include one or more materials that become part of a layer 511 formed over substrate 501.

As shown, first target 520 and second target 524 are oriented or aimed toward substrate 501. The angles may be symmetric or not, and may be adjustable before or during operation. Materials in the targets 520 and 524 may include, for example, metals, alloys, metal oxides, metal nitrides, or metal oxynitrides. Although two targets 520 and 524 are shown, a different number of targets may be used (e.g., one or more than two).

The PVD tool also includes a first power supply 530 coupled to the first target electrode 522 and a second power supply 532 coupled to the second target electrode 524. Power supplies 530 and 532 may supply direct current (DC), pulsed DC, or AC power to the respective electrodes, causing material to be ejected from the respective targets toward substrate 501. In some embodiments, material may be simultaneously sputtered or "co-sputtered" from both targets 520 and 524.

Housing 502 includes a gas inlet 512 and a gas outlet 514 connecting to chamber 504. During sputtering, inert gases, such as argon or krypton, or plasma species may be injected into process chamber 504 through gas inlet 512, and a vacuum may be applied to the gas outlet 514. The inert gas(es) or plasma species may be used to impact the targets 520 and 524 to promote ejection of target material. For reactive sputtering, reactive gases such as oxygen and/or nitrogen may be injected to react with atoms or molecules ejected from the targets (i.e., to form an oxide, nitride, or oxynitride layer 511).

Although not shown, the PVD tool may be controlled by a control system having, for example, a processor and a memory, and communicatively connected to one or more of chamber 504, substrate support 506, power supplies 530 and 532, gas inlet 512, gas outlet 514, and other components to control power, gas flow, electric or magnetic fields, pressure, temperature, and other parameters.

Oxide layers may be sputtered in a number of different ways: (1) sputtered from a composite oxide target; (2) co-sputtered from two or more oxide targets; (3) sputtered from one or more metal targets in an oxidizing ambient; or (4) sputtered from one or more oxide targets and one or more metal targets in an oxidizing ambient. By way of non-limiting example, a composite oxide target for (1) may be ITO, ZnO, AZO, or IZO; an oxide target for (2) or (4) may be $In_2O_3$, $SnO_2$, or ZnO; a metal target for (3) or (4) may be In, Sn, Al, or Zn or an alloy thereof; and an oxidizing ambient for (3) or (4) may include H2O, $O_2$, $O_3$, or $NO_2$.

Metal layers may be sputtered from a metal target in an inert ambient such as Ar. Non-limiting examples of the metal target include Al, Ti, or an alloy. In some embodiments, the chamber may be purged between the oxide sputtering and the metal sputtering.

In some embodiments, the power density at the targets may be about 1-7 W/cm2 for oxide targets (e.g., 50-300 W for a 7.5-cm diameter circular target) and about 2.5-15 W/cm2 for metal targets (e.g., 50-300 W for a 5-cm diameter circular target). Chamber ambient may include Ar or, for an oxidizing ambient, 1-5% partial pressure of oxygen. The deposition temperature may be between about 20 C and 30 C, e.g., 25 C.

If the substrate holder can heat the substrate to the desired temperature, the annealing may be done in-situ in the PVD chamber. The annealing may heat the substrate to between 350 C and 650 C in nitrogen ($N_2$) ambient for between about 3 minutes and 10 minutes.

Alternatively, some of the transparent conductive contacts may be fabricated by atomic layer deposition (ALD).

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. An optoelectronic device comprising:
a III-V semiconductor region; and
a transparent conductive layer in direct contact with the III-V semiconductor region;
wherein the transparent conductive layer comprises transparent conductive oxide of a first metal, and
wherein the transparent conductive layer further comprises a second metal, and
wherein a concentration of the second metal is uniform within the transparent conductive layer.

2. The device of claim 1, wherein a work function of the transparent conductive layer matches a work function of the III-V semiconductor region within ±0.2 eV.

3. The device of claim 1, wherein the second metal comprises aluminum or titanium.

4. The device of claim 1, wherein the transparent conductive oxide of the first metal comprises indium tin oxide.

5. The device of claim 4, wherein the indium tin oxide comprises about 90 wt % indium oxide and about 10 wt % tin oxide.

6. The device of claim 1, wherein the transparent conductive oxide of the first metal comprises zinc oxide.

7. The device of claim 6, wherein the transparent conductive oxide comprises aluminum zinc oxide having 0.1-5 wt % aluminum or indium zinc oxide having 0.1-5 wt % indium.

8. The device of claim 1, wherein the transparent conductive layer of the first metal further comprises an oxide of the second metal.

9. The device of claim 1, wherein the transparent conductive layer has a thickness between about 50nm and about 100nm.

10. The device of claim 1, wherein the transparent conductive layer is at least 30% crystalline.

11. The device of claim 1, wherein the III-V semiconductor region comprises gallium nitride.

12. The device of claim 1, wherein the transparent conductive layer comprises substitutional defects.

13. The device of claim 1, wherein a specific contact resistivity of an interface between the transparent conductive layer and the III-V semiconductor surface is less than about 0.005 $\Omega$-cm2.

14. The device of claim 1, wherein the transparent conductive layer has an optical absorption below about 0.03%/nm for a visible wavelength.

15. The device of claim 1, wherein at least a portion of metal atoms of the second metal in the transparent conductive layer are not bound to other atoms.

16. The device of claim 1, wherein a work function of the transparent conductive layer is between about 4 eV and 5 eV.

17. The device of claim 1, wherein the transparent conductive oxide comprises aluminum zinc oxide having 0.1-5 wt % aluminum.

18. The device of claim 1, wherein the second metal comprises aluminum.

19. The device of claim 1, wherein the III-V semiconductor region comprises n-GaN.

20. The device of claim 1, wherein the III-V semiconductor region comprises p-GaN.

* * * * *